United States Patent [19]
Jun

[11] Patent Number: 6,049,358
[45] Date of Patent: Apr. 11, 2000

[54] COUNTER CONTROL CIRCUIT FOR CONTROLLING COUNTER HAVING A PULSE PERIOD MEASURING FUNCTION

[75] Inventor: Sung-Gon Jun, Kyungki-do, Rep. of Korea

[73] Assignee: SamSung Electronics Co., Ltd., Kyungki-do, Rep. of Korea

[21] Appl. No.: 08/888,648

[22] Filed: Jul. 7, 1997

[30] Foreign Application Priority Data

Jul. 5, 1996 [KR] Rep. of Korea ................ 96-20094

[51] Int. Cl.$^7$ .................. H03L 7/00; G01R 29/02
[52] U.S. Cl. .............. 348/546; 348/542; 348/510; 327/31; 377/44; 377/15
[58] Field of Search .................. 348/525, 529, 348/530, 531, 510, 540, 542, 543, 546; 324/76.39; 327/31, 33; 377/15, 44, 78, 107, 2, 3, 6, 19, 20, 30, 31, 56

[56] References Cited

U.S. PATENT DOCUMENTS

| | | | |
|---|---|---|---|
| 4,717,950 | 1/1988 | Wesolowski | 348/498 |
| 4,722,004 | 1/1988 | Miyamoto et al. | 327/31 |
| 4,891,705 | 1/1990 | Suzuki et al. | 348/511 |
| 4,937,782 | 6/1990 | Mizugaki | 364/900 |
| 5,134,481 | 7/1992 | Gornati et al. | 348/558 |
| 5,140,421 | 8/1992 | Sumiyoshi | 348/512 |
| 5,159,454 | 10/1992 | Mori | 348/531 |
| 5,175,620 | 12/1992 | Kim | 348/526 |
| 5,357,451 | 10/1994 | Beaudry | 364/561 |
| 5,390,224 | 2/1995 | Komatsuta | 377/56 |
| 5,495,294 | 2/1996 | Evans | 348/536 |
| 5,499,199 | 3/1996 | Demas | 364/561 |

Primary Examiner—John K. Peng
Assistant Examiner—Wesner Sajous
Attorney, Agent, or Firm—Robert E. Bushnell, Esq.

[57] ABSTRACT

A counter control circuit of a counter for measuring a pulse period of a video synchronization signal includes a main control unit having a synchronization signal input Sync, and a control signal producing unit including a stop signal generator, a latch signal generator, and a start signal generator. The outputs of the stop, latch and start signal generators are supplied to the counter for controlling the counter to count clock pulses fed from a clock generator in response to receipt of a start signal and output a count value in response to receipt of a latch signal. The main control unit produces sequential control signals during the input of the video synchronization signal differentiated by the clock pulses. The counter control circuit allows the counter to measure a pulse period of an input synchronization signal in a stable state that results in an accurate count value, since the count operation is first stopped and the count value is latched by the clock signal.

16 Claims, 4 Drawing Sheets

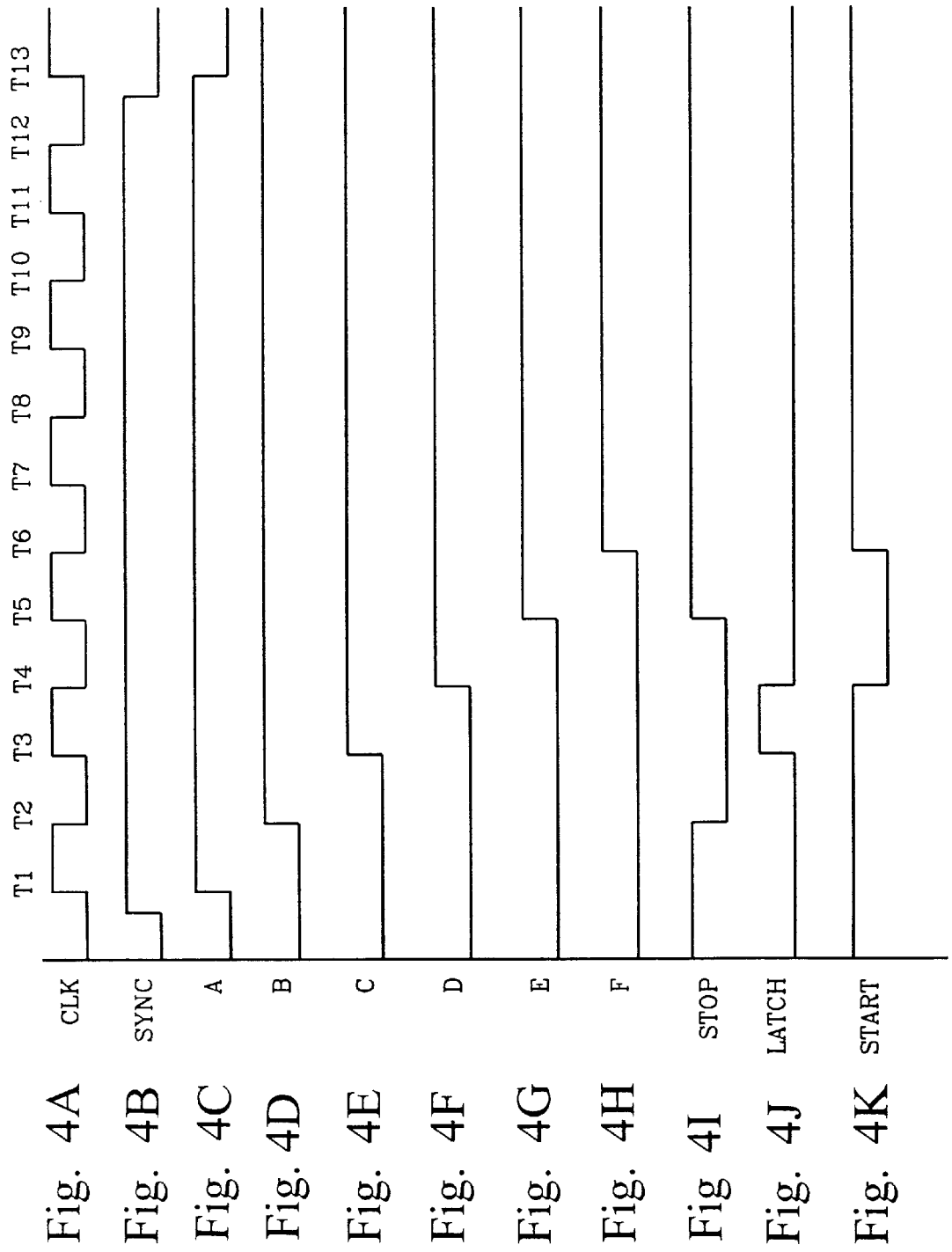

6,049,358

COUNTER CONTROL CIRCUIT FOR CONTROLLING COUNTER HAVING A PULSE PERIOD MEASURING FUNCTION

CLAIM FOR PRIORITY

This application makes reference to, incorporates the same herein, and claims all benefits accruing under 35 U.S.C. §119 from an application for APPARATUS FOR CONTROLLING COUNTER HAVING A PULSE PERIOD MEASURING FUNCTION earlier filed in the Korean Industrial Property Office on Jul. 8, 1996, and there duly assigned Ser. No. 96-20094, a copy of which application is annexed hereto.

BACKGROUND OF THE INVENTION

1. Technical Field

The present invention relates to a counter control circuit for digital counters and, more particularly, relates to a counter control circuit for controlling counting operation of a counter to accurately measure a pulse period of a video synchronization signal in a video display monitor.

2. Related Art

Conventional digital systems use a synchronization signal to control the timing of the execution of a command and to perform a desired operation during a pulse duration. The synchronization signal is formed by a series of logical high or low level pulses and can be periodically generated for enabling selective performance of a series of specific operations. Thus, each mode of operation can be changed by varying a pulse duration of each pulse of the synchronization. A typical request for changing an operation mode by varying the pulse duration can be exemplified by a horizontal synchronization signal and a vertical synchronization signal used in a video display monitor. That is, for example, an application program contained in a computer system such as a PC provides different image data by changing the operation mode of a video synchronization signal.

Meanwhile, modern video display monitors require many functional operations adapted to multimedia environment. One solution to multi-functional operations is to enable the display monitors to perform each operation based on an input mode of the video synchronization signal fed from the computer system. A video synchronization signal is discriminated such that if an excessive level of the video synchronization signal is entered into the display monitor, the input of the video synchronization signal is cut off to prevent the display monitor from being damaged. Thus, in order to discriminate the mode of operation based on the video synchronization signal, each pulse period of the video synchronization signal must be measured. Contemporary pulse measurement techniques are disclosed, for example, in U.S. Pat. No. 4,722,004 for Video Signal Discriminating Apparatus issued to Miyamoto et al., U.S. Pat. No. 5,134,481 for Method Of Automatically Measuring The Horizontal Scan Frequency Of A Composite Synchronism Signal, And A Electronic Circuit Operating In Accordance With The Method issued to Gornati et al., U.S. Pat. No. 5,175,620 for Synchronism Detecting Circuit Utilizing Pulse Width issued to Kim.

Many contemporary pulse measurement techniques, however, contain a number of drawbacks. First, the count value for pulse measurement is typically not accurate. Second, the starting point of a counting operation is generally indefinite.

SUMMARY OF THE INVENTION

Accordingly, it is therefore an object of the present invention to provide an improved counter control circuit for controlling a counter having a pulse period measuring function.

It is also an object to provide a counter control circuit for controlling counting operation of a counter to accurately measure a pulse period of a video synchronization signal in a video display monitor.

These and other objects of the present invention can be achieved by a counter control circuit for measurement of a period of a video synchronization signal, which comprises a clock generator for producing a series of clock pulses having the same period; a counter for counting the clock pulses fed from the clock generator in response to receipt of a start signal, and for outputting a count value indicating measurement of the period of each pulse of the pulse signal in response to receipt of a latch signal; a main controller in response to the video synchronization signal to generate sequential control signals during the receipt of the pulse signal differentiated by the clock pulse; a stop signal generator in response to a first combination of the sequential control signals to produce a stop signal supplied to the counter to stop counting of the clock pulses at a preset time point within the period of each pulse of the video synchronization signal; a latch signal generator in response to a second combination of the sequential control signals to produce the latch signal supplied to the counter to latch the count value of the counter at a time point within a stop signal duration; and a start signal generator in response to a third combination of the sequential control signals to produce the start signal supplied to the counter to restart the counting at the time point after the latch signal is generated.

Preferably, the main controller includes a first D-type flip-flop having an input terminal coupled to receive the video synchronization signal, a clock terminal coupled to receive the clock pulses, and a reset terminal coupled to receive a reset signal for resetting operation, and an output terminal. A second D-type flip-flop having an input terminal connected to the output terminal of the first D-type flip-flop, a clock terminal coupled to receive the clock pulses, a reset terminal coupled to receive a reset signal for resetting operation, and an output terminal to produce a first control signal. A third D-type flip-flop having an input terminal coupled to receive the first control signal, a clock terminal coupled to receive the clock pulses, a reset terminal coupled to receive a reset signal for resetting operation, and an output terminal to produce a second control signal. A fourth D-type flip-flop having an input terminal coupled to receive the second control signal, a clock terminal coupled to receive the clock pulses, a reset terminal coupled to receive a reset signal for resetting operation, and an output terminal to produce a third control signal. A fifth D-type flip-flop having an input terminal coupled to receive the third control signal, a clock terminal coupled to receive the clock pulses, a reset terminal coupled to receive a reset signal for resetting operation, and an output terminal to produce a fourth control signal. And a sixth D-type flip-flop having an input terminal coupled to receive the fourth control signal, a clock terminal coupled to receive the clock pulse and a reset terminal coupled to receive a reset signal for resetting operation, and an output terminal to produce a fifth control signal.

A stop signal generator includes an OR gate having input terminals coupled to receive the first and fourth control signals from the main controller to generate the stop signal for enabling the counter to stop counting. A latch signal generator includes an AND gate having input terminals coupled to receive the second and third control signals from the main controller to generate the latch signal for enabling the counter to produce the count value indicating measurement of the period of each pulse of the video synchronization signal. A start signal generator includes an inverter for inverting the fifth control signal, and a AND gate having input terminals coupled to receive the third control signal from the main controller and an invert of the fifth control signal from the inverter to generate the start signal for enabling the counter to start counting the clock pulses fed from the clock generator for measurement of the period of each pulse of the video synchronization signal.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 4A–4K are timing charts for explaining operation of the counter control circuit as shown in FIGS. 2 and 3.

DETAILED DESCRIPTION OF THE PREFERRED EMBODIMENT

Figure 1:
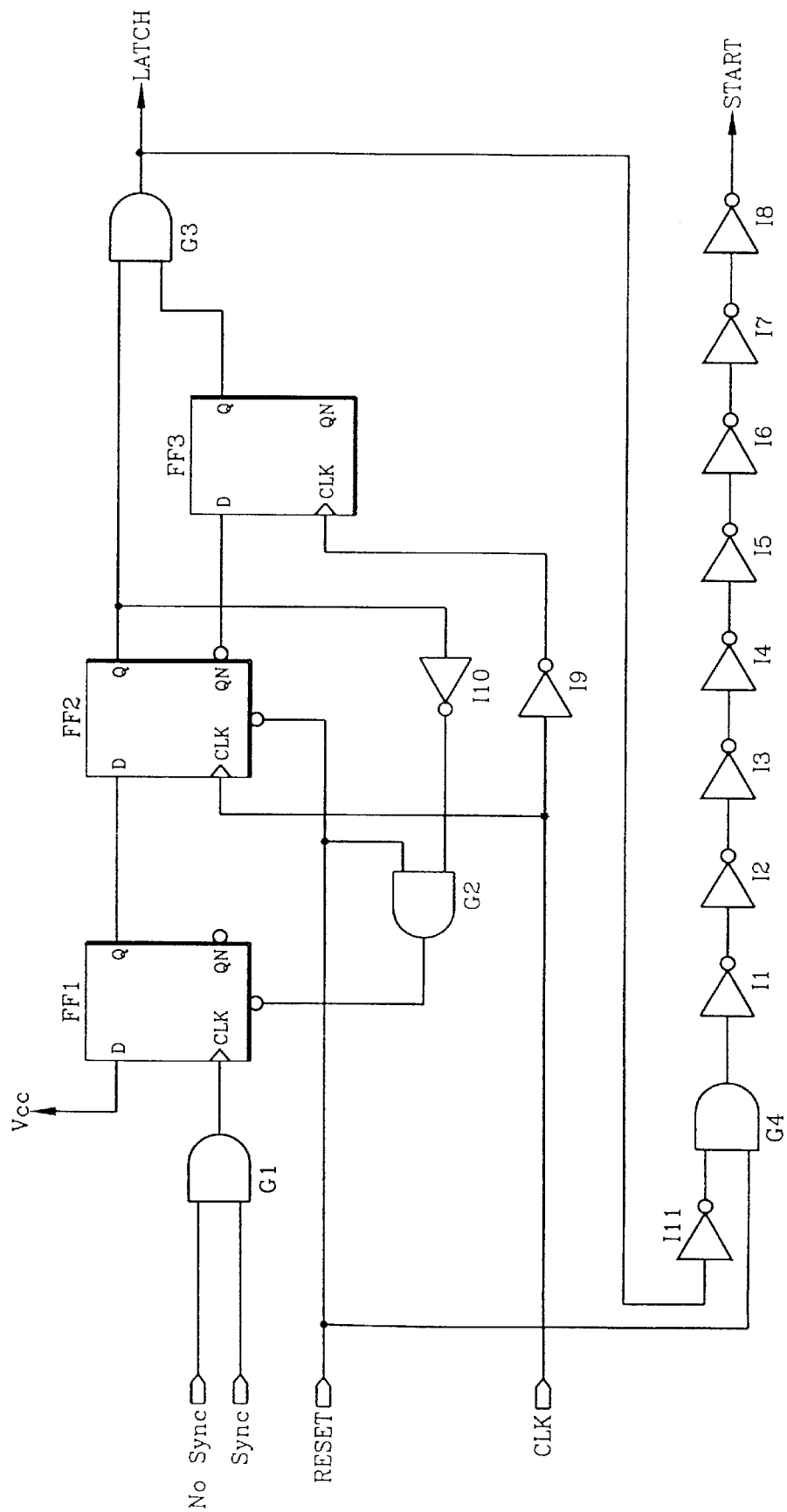
FIG. 1 is a block diagram of a contemporary counter control circuit for a counter having pulse period measuring function.

Referring now to the drawings and particularly to FIG. 1, which illustrates a contemporary counter control circuit for controlling counter operation. This counter control circuit includes a series of AND gates G1–G4, flip-flops FF1–FF3, and time delay inverters I1–I8 arranged to generate a latch signal LATCH to a counter (not shown) which allows an internal timer to output a count value stored in the counter and a start signal START the counter which resets the counter and to restarts the counting operation.

As shown in FIG. 1, the first AND gate G1 has input terminals coupled to receive a synchronization signal Sync and a synchronization input check signal No Sync, and an output terminal coupled to a clock input of a first D type flip-flop FF1. The output Q of the first flip-flop FF1 is connected to the D input of a second D type flip-flop FF2. Control signal inputs such as a reset signal RESET and a clock signal CLK are fed to a reset input and clock input of the second flip-flop FF2, respectively. The reset signal is also fed to the reset input of the first flip-flop FF1 through an AND gate G2, and the clock signal is fed to the clock input of a third D type flip-flop FF3 through an inverter I9. The Q outputs of the flip-flop FF2 and FF3 are connected to two inputs of an AND gate G3. The D input of the first flip-flop FF1 is connected to a supply voltage Vcc terminal that holds the logic high level. Also, the inverted output of the second flip-flop FF2 is connected to the D input of the third flip-flop FF3.

The output of the AND gate G3 forms one output terminal fed to the counter, which provides a latch signal LATCH that allows the timer to output a count value stored in the counter. This latch signal output is connected to one input of an AND gate G4 through an inverter I11, and the reset input terminal is connected to the other input of the AND gate G4. The output of the AND gate G4 is coupled to a series of time delay inverters I1~I8 to form another output terminal fed to the counter, which provides a start signal START that allows the counter to start counting again. Thus, once the count value is output by the latch signal, the start signal START is produced after a predetermined time has elapsed so as to reset the counter and restart the counting operation.

Such a contemporary counter control circuit, however, has a number of drawbacks. First, the count value is not accurate since the latch signal LATCH is produced when the counting operation of the counter is proceeding. Second, since the start signal START is produced through a plurality of the inverters, establishing the restart point of the counter can be indefinite.

Figure 2:
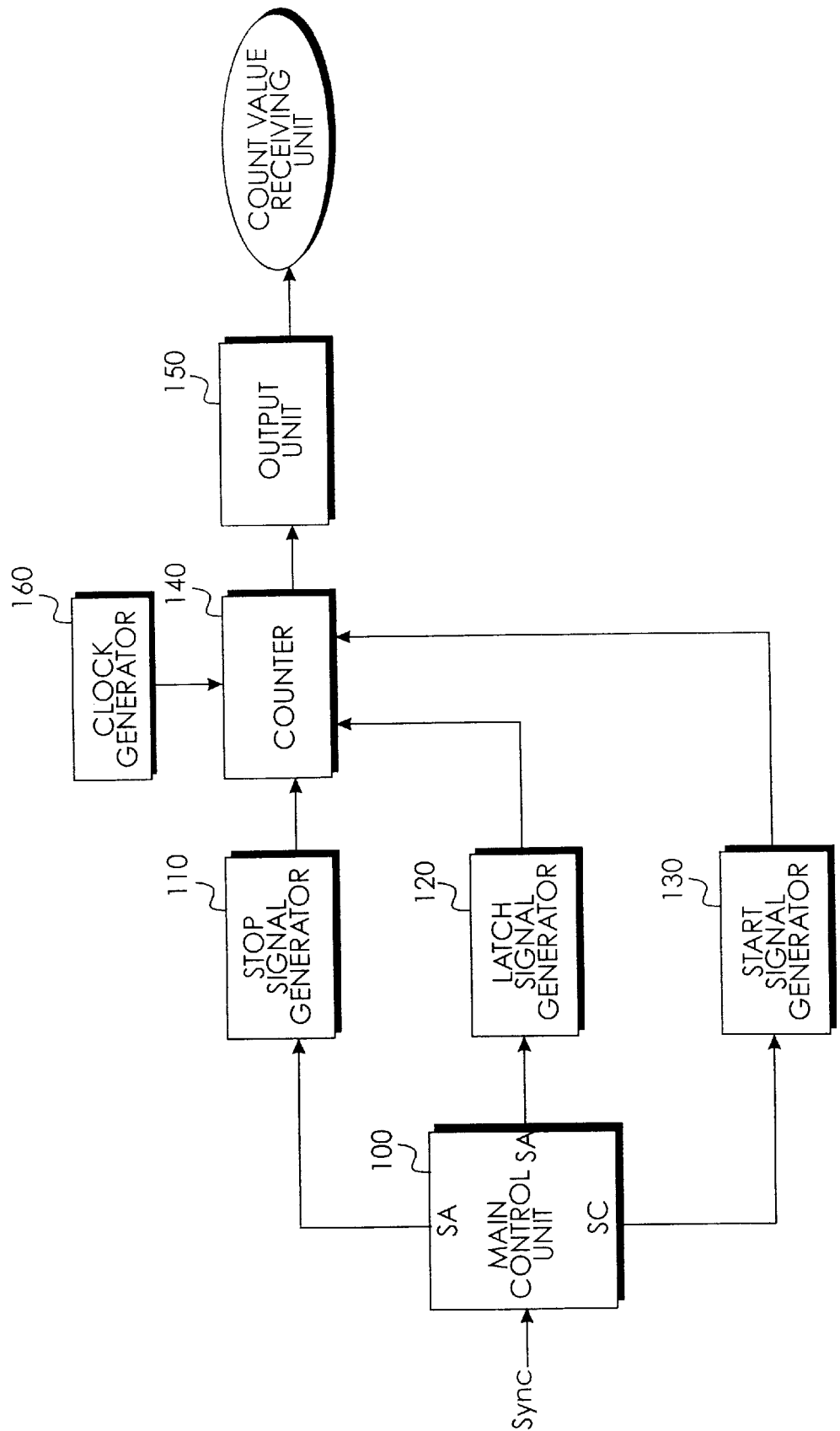
FIG. 2 is a block diagram of a counter control circuit constructed according to the principles of the present invention.

Turning now to FIG. 2, which illustrates a counter control circuit for controlling counting operation of a counter in order to accurately measure a pulse period of a video synchronization signal in a video display monitor according to the principles of the present invention. As shown in FIG. 2, the counter control circuit includes a main control unit 100 coupled to receive a synchronization signal input Sync, and a control signal producing unit including a stop signal generator 110, a latch signal generator 120, and a start signal generator 130 all coupled to the main control unit 100 to generate a stop signal STOP, a latch signal LATCH, and a start signal fed START fed to a counter 140 for controlling the counting operation. Counter 140 has a clock generator 160 connected thereto and also has an output unit 150 connected thereto for supplying a count value to a count value receiving unit.

In general, the counter 140 starts to count a clock signal generated by the clock generator 160 when a start signal START is output from the start signal generator 130 at a preset time point. When the count is proceeding during the desired time interval and reaches a preset time point, the stop signal generator 110 outputs a stop signal STOP. At the moment, the counter 140 receives the stop signal STOP to stop counting. Then, when the latch signal generator 120 produces a latch signal LATCH and it is applied to the counter 140, the count value stored in the counter 140 is supplied to the output unit 150.

The main control unit 100 comprises a sequential digital system, for example, a plurality of flip-flops, and receives a horizontal synchronization signal H_Sync or a vertical synchronization signal V_Sync according to the purpose of monitor function control. The synchronization signal supplied to the main control unit 100 cooperates with the clock signal to supply sequential output signals to the stop, latch and start signal generators 110, 120, and 130.

Figure 3:
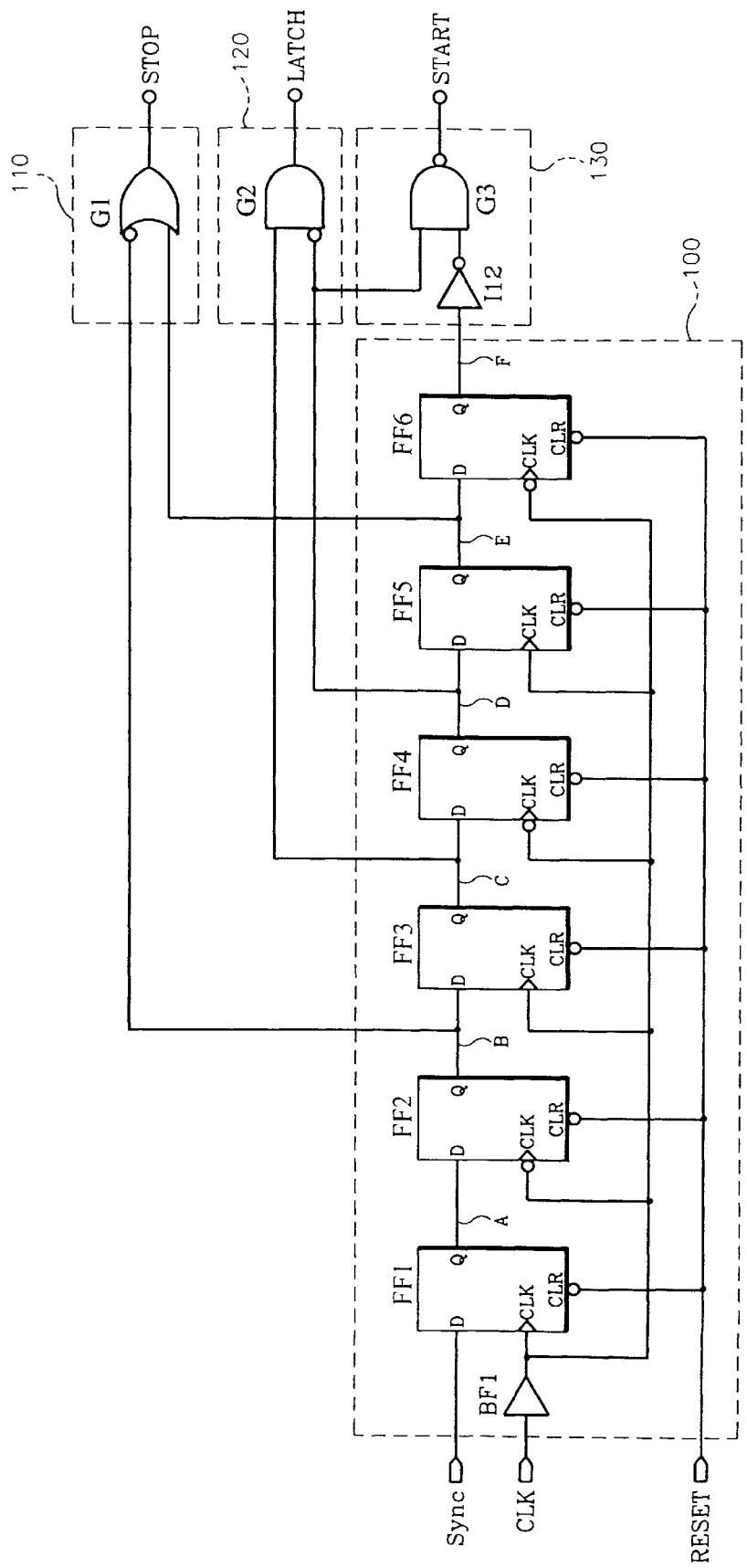
FIG. 3 is a detailed circuit diagram of the counter control circuit constructed according to the present invention.

FIG. 3 illustrates a detailed circuit diagram of the counter control circuit as shown in FIG. 2. The main control unit 100 comprises a series of D-type flip-flops FF1~FF6 and a buffer BF1 serially connected to receive a synchronization signal Sync, a clock signal CLK and a reset signal. In addition, the stop signal generator 110 comprises an OR gate G1, the latch signal generator 120 comprises an AND gate G2, and the start signal generator 130 comprises a NAND gate G3 and an inverter I12.

In this embodiment, for example, the horizontal synchronization signal is applied to the synchronization signal input terminal Sync of the main control unit 100 and this is supplied to the D input of the first flip-flop FF1. The D input of the rest flip-flops FF2~FF6 are connected to the Q output of each preceding flip-flop. Further, at the clock input terminal CLK, the clock signal fed from the clock generator 160 (as shown in FIG. 2) is applied. The CLK input terminal is connected to each clock input of the flip-flops FF1~FF6 via the buffer BF1. Also, the reset signal input RESET of the main control unit 100 is connected to each clear input of the flip-flops FF1~FF6.

Further, the output Q of the second flip-flop FF2 is connected via an inverter to one input of the OR gate G1 constituting the stop signal generator 110, and the output Q of the third flip-flop FF3 is connected to one input of the AND gate G6 constituting the latch signal generator 120. Also, the other input of the AND gate G2 is connected by the output Q of the fourth flip-flop FF4, and the output Q of the fifth flip-flop FF5 is connected to the other input of the OR gate G1. Lastly, the output Q of the sixth flip-flop FF6 is connected to one input of the NAND gate G3 constituting the start signal generator 130 through an inverter I12, and the other input of the NAND gate G3 is commonly connected to the output Q of the fourth flip-flop FF4.

The operation of the counter control circuit will now be described with reference to FIGS. 4A–4K hereinbelow. As shown in the timing chart of FIGS. 4A–4K, the clock signal CLK having a constant pulse period is applied to each clock input of the D type flip-flops FF1~FF6. If the horizontal synchronization signal SYNC applied to the D input of the first flip-flop FF1 maintains a logical high level, for example, from the time point T1 of the clock signal CLK to the time point T12, that is, during which six clock pulses are input, the output signal A of the first flip-flop FF1 is inverted to the logical high level at the time point T1, the rising edge of the first clock pulse. Subsequently, the output signal B of the second flip-flop FF1 is inverted to the high level at the time point T2, the falling edge of the first clock pulse, and the output signal C of the third flip-flop FF3 is inverted to the high level at the time point T3, the rising edge of the second clock pulse. Like this, the output signal D of the fourth flip-flop FF4 at the time point T4 (falling edge of the second pulse), the output signal E of the fifth flip-flop FF5 at the time point T5 (rising edge of the third clock pulse), and the output signal F of the sixth flip-flop FF6 at the time point T6 (falling edge of the third pulse).

In this connection, the output of the OR gate G1, at which a stop signal STOP is produced, initial logic high level STOP signal falls to the low level at the time the output signal B of the second flip-flop FF2 has inverted to the high level (at the time point T2), and rises again to the high level at the time the output signal E of the fifth flip-flop FF5 has inverted to the high level (at the time point T5). Thus, this stop signal STOP permits the counter 140 to stop counting during the time interval T2~T5.

Further, the output of the AND gate G6, at which a latch signal LATCH is produced, initial logic low level LATCH signal rises to the high level at the time the output signal C of the third flip-flop FF6 has inverted to the high level (at the time point T3), and falls again to the low level at the time the output signal D of the fourth flip-flop FF4 has inverted to the high level (at the time point T4). Thus, this latch signal permits the counter 140 to output a counting value during the time interval T3~T4.

In addition, the output of the NAND gate G3, at which a start signal START is produced, initial logic high level START signal falls to the low level at the time the output signal D of the fourth flip-flop FF4 has inverted to the high level (at the time point T4), and rises again to the high level at the time the output signal F of the sixth flip-flop FF6 has inverted to the high level (at the time point T6). Thus, this start signal START permits the counter 140 to be initialized during the time interval T4~T6, and to restart counting at the time point T6.

As apparent from foregoing, the timer control apparatus of the present invention is capable of producing the control signals, that is STOP, LATCH, and START signals such that the signals are generated at the time point differentiated by the clock signal. This will allows the counter to measure a pulse period of entering synchronization signals in a stable state that results in an accurate count value, since the count operation is first stopped and the count value is latched by the clock signal. In addition, with the arrangement, the maximum time measurement error of the counter will be the same as the period of the clock signal. For example, in the case of 10 MHz clock signals, the maximum measurement time error will be only 0.1 microseconds. Further, predicting the occurring time point of the control signals is possible.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A counter control circuit for measurement of a period of a pulse signal, comprising:

a clock generator for producing a series of clock pulses having the same period;

a counter for counting the clock pulses fed from the clock generator in response to receipt of a start signal, and for outputting a count value indicating measurement of the period of each pulse of the pulse signal in response to receipt of a latch signal;

a controller in response to the pulse signal to generate sequential control signals during the receipt of the pulse signal differentiated by the clock pulses;

a stop signal generator in response to a first combination of the sequential control signals to produce a stop signal supplied to the counter to stop counting the clock pulses at a preset time point within the period of each pulse of the pulse signal;

latch signal generator in response to a second combination of the sequential control signals to produce the latch signal supplied to the counter to latch the count value of the counter at a time point within a stop signal duration; and a start signal generator in response to a third combination of the sequential control signals to produce the start signal supplied to the counter to restart the counting at the time point after the latch signal is generated.

2. The counter control circuit of claim 1, comprised of the pulse signal corresponding to a video synchronization signal fed from a computer system.

3. The counter control circuit of claim 1, further comprised of said controller comprising a series of D-type flip-flops, each having a data terminal connected to an output terminal of a preceding flip-flop and the data terminal of a first flip-flop coupled to receive the pulse signal, each having a clock terminal coupled to receive the clock pulses and a reset terminal coupled to receive a reset signal for resetting operation.

4. The counter control circuit of claim 1, further comprised of said controller comprising:

a first D-type flip-flop having an input terminal coupled to receive the video synchronization signal, a clock terminal coupled to receive the clock pulses, and a reset terminal coupled to receive a reset signal for resetting operation;

a second D-type flip-flop having an input terminal connected to an output terminal of the first D-type flip-flop, a clock terminal coupled to receive the clock pulses, a reset terminal coupled to receive a reset signal for resetting operation, and an output terminal to produce a first control signal;

a third D-type flip-flop having an input terminal coupled to receive the first control signal, a clock terminal coupled to receive the clock pulses, a reset terminal coupled to receive a reset signal for resetting operation, and an output terminal to produce a second control signal;

a fourth D-type flip-flop having an input terminal coupled to receive the second control signal, a clock terminal coupled to receive the clock pulses, a reset terminal coupled to receive a reset signal for resetting operation, and an output terminal to produce a third control signal;

a fifth D-type flip-flop having an input terminal coupled to receive the third control signal, a clock terminal coupled to receive the clock pulses, a reset terminal coupled to receive a reset signal for resetting operation, and an output terminal to produce a fourth control signal; and a sixth D-type flip-flop having an input terminal coupled to receive the fourth control signal, a clock terminal coupled to receive the clock pulses, a reset terminal coupled to receive a reset signal for resetting operation, and an output terminal to produce a fifth control signal.

5. The counter control circuit of claim 4, further comprised of said stop signal generator comprising an OR gate having input terminals coupled to receive said first and said fourth control signal from said controller to generate said stop signal for enabling said counter to stop counting.

6. The counter control circuit of claim 5, further comprised of said latch signal generator comprising an AND gate having input terminals coupled to receive said second and said third control signal from said controller to generate said latch signal for enabling said counter to produce said count value indicating measurement of the period of each pulse of the video synchronization signal.

7. The counter control circuit of claim 6, further comprised of said start signal generator comprising an inverter for inverting said fifth control signal, and a NAND gate having input terminals coupled to receive said third control signal from said controller and an invert of said fifth control signal from said inverter to generate said start signal for enabling said counter to start counting said clock pulses fed from the clock generator for measurement of the period of each pulse of said video synchronization signal.

8. The counter control circuit of claim 5, further comprised of said latch signal generator comprising an AND gate having input terminals coupled to receive said second and said third control signal from said controller to generate said latch signal for enabling said counter to produce said count value indicating measurement of the period of each pulse of the video synchronization signal.

9. The counter control circuit of claim 5, further comprised of said start signal generator comprising an inverter for inverting said fifth control signal, and a NAND gate having input terminals coupled to receive said third control signal from said controller and an invert of said fifth control signal from said inverter to generate said start signal for enabling said counter to start counting said clock pulses fed from the clock generator for measurement of the period of each pulse of said video synchronization signal.

10. A counter control circuit for measurement of a period of a video synchronization signal, comprising:

a clock generator for producing a series of clock pulses;

a counter for counting the clock pulses fed from the clock generator in response to receipt of a start signal, and for outputting a count value indicating measurement of the period of each pulse of the video synchronization signal response to receipt of a latch signal;

a first D-type flip-flop having an input terminal coupled to receive the video synchronization signal, a clock terminal coupled to receive the clock pulses, and a reset terminal coupled to receive a reset signal for resetting operation;

a second D-type flip-flop having an input terminal connected to an output terminal of the first D-type flip-flop, a clock terminal coupled to receive the clock pulses, a reset terminal coupled to receive a reset signal for reset operation, and an output terminal to produce a first control signal;

a third D-type flip-flop having an input terminal coupled to receive the first control signal, a clock terminal coupled to receive the clock pulses, a reset terminal coupled to receive a reset signal for resetting operation, and an output terminal to produce a second control signal;

a fourth D-type flip-flop having an input terminal coupled to receive the second control signal, a clock terminal coupled to receive the clock pulses, a reset terminal coupled to receive a reset signal for resetting operation, and an output terminal to produce a third control signal;

a fifth D-type flip-flop having an input terminal coupled to receive the third control signal, a clock terminal coupled to receive the clock pulses, a reset terminal coupled to receive a reset signal for resetting operation, and an output terminal to produce a fourth control signal;

a sixth D-type flip-flop having an input terminal coupled to receive the fourth control signal, a clock terminal coupled to receive the clock pulses, a reset terminal coupled to receive a reset signal for resetting operation, and an output terminal to produce a fifth control signal;

an OR gate coupled to receive said first and said fourth control signal to generate said stop signal for enabling said counter to stop counting the clock pulses at a preset time point within the period of each pulse of the video synchronization signal;

an AND gate coupled to receive said second and said second control signal to generate said latch signal for enabling said counter to produce said count value indicating measurement of the period of each pulse of the video synchronization signal;

an inverter coupled to receive said fifth control signal; and a NAND gate coupled to receive said third control and an invert of said fifth control signal from said inverter to generate said start signal for enabling said counter to start counting said clock pulses for measurement of the period of each pulse of said video synchronization signal.

11. A process of controlling a counter for measurement of a period of a synchronization signal, comprising the steps of:

counting, by said counter, clock pulses in response to receipt of a start signal, and generating, from said counter, a count value indicating measurement of the period of each pulse of the synchronization signal in response to receipt of a latch signal;

sequential generating control signals in response to receipt of said synchronization signal differentiated by the clock pulses;

generating a stop signal, in response to receipt of first selected ones of said control signals, supplied to said counter to stop said counter from counting the clock pulses within the period of each pulse of the synchronization signal;

generating said latch signal, in response to receipt of second selected ones of said control signals, supplied to said counter to latch the count value of said counter at a time point within a stop signal duration; and generating said start signal, in response to receipt of third selected ones of said control signals, supplied to said counter to restart counting at the time point after the latch signal is generated.

12. The process of claim 11, further comprises of said control signals being generated via a series of D-type flip-flops, each having a data terminal connected to an output terminal of a preceding flip-flop and the data terminal of a first flip-flop coupled to receive the synchronization signal, each having a clock terminal coupled to receive the clock pulses and reset terminal coupled to receive a reset signal for resetting operation.

13. The process of claim 12, further comprised of said series of D-type of flip-flops including:

a first D-type flip-flop having an input terminal coupled to receive the synchronization signal, a clock terminal coupled to receive the clock pulses, and a reset terminal coupled to receive a reset signal for resetting operation;

a second D-type flip-flop having an input terminal connected to an output terminal for the first D-type flip-flop, a clock terminal coupled to receive the clock pulses, a reset terminal coupled to receive a reset signal for resetting operation, and an output terminal to produce a first control signal;

a third D-type flip-flop having an input terminal coupled to receive the first control signal, a clock terminal coupled to receive the clock pulses, a reset terminal coupled to receive a reset signal for resetting operation, and an output terminal to produce a second control signal;

a fourth D-type flip-flop having an input terminal coupled to receive the second control signal, a clock terminal coupled to receive the clock pulses, a reset terminal coupled to receive a reset signal for resetting operation, and an output terminal to produce a third control signal;

a fifth D-type flip-flop having an input terminal coupled to receive the third control signal, a clock terminal coupled to receive the clock pulses, a reset terminal to produce a fourth control signal; and a sixth D-type flip-flop having an input terminal coupled to receive the fourth control signal, a clock terminal coupled to receive the clock pulses, a reset terminal coupled to receive a reset signal for resetting operation, and an output terminal to produce a fifth control signal.

14. The process of claim 13, further comprised of said stop signal being generated via an OR gate coupled to receive said first control signal and said fourth control signal constituting said first selected ones of said control signals.

15. The process of claim 13, further comprised of said latch signal being generated via an AND gate coupled to receive said second control signal and said third control signal constituting said second selected ones of said control signals.

16. The process of claim 15, further comprised of said start signal being generated via an inverter and a NAND gate coupled to receive said third control signal and an invert of said fifth control signal constituting said third selected ones of said control signals, via said inverter, for measurement of the period of each pulse of said video synchronization signal.

* * * * *